United States Patent
Bao et al.

(10) Patent No.: US 12,411,183 B2
(45) Date of Patent: Sep. 9, 2025

(54) METHOD AND APPARATUS FOR MEASURING BATTERY IMPEDANCE VALUE

(71) Applicant: SHANGHAI GREEN EAR TECHNOLOGY CO., LTD., Shanghai (CN)

(72) Inventors: Yun Bao, Shanghai (CN); Gongshun Bao, Shanghai (CN)

(73) Assignee: SHANGHAI GREEN EAR TECHNOLOGY CO., LTD., Shanghai (CN)

(*) Notice: Subject to any disclaimer, the term of this patent is extended or adjusted under 35 U.S.C. 154(b) by 0 days.

(21) Appl. No.: 18/031,689

(22) PCT Filed: Oct. 13, 2021

(86) PCT No.: PCT/CN2021/123514
§ 371 (c)(1),
(2) Date: Apr. 13, 2023

(87) PCT Pub. No.: WO2022/078379
PCT Pub. Date: Apr. 21, 2022

(65) Prior Publication Data
US 2023/0393215 A1 Dec. 7, 2023

(30) Foreign Application Priority Data
Oct. 13, 2020 (CN) .......................... 202011090591.8

(51) Int. Cl.
*G01R 31/389* (2019.01)
*G01R 31/367* (2019.01)

(52) U.S. Cl.
CPC ......... *G01R 31/389* (2019.01); *G01R 31/367* (2019.01)

(58) Field of Classification Search
CPC .... G01R 27/02; G01R 31/374; G01R 31/389; G01R 31/367; G01R 31/392; H01M 10/44; Y02E 60/10
See application file for complete search history.

(56) References Cited

U.S. PATENT DOCUMENTS

| | | | |
|---|---|---|---|
| 10,705,152 B1* | 7/2020 | Weiss | G01R 31/389 |
| 2003/0041445 A1* | 3/2003 | Jang | H01M 10/4207 |
| | | | 429/156 |

(Continued)

FOREIGN PATENT DOCUMENTS

| | | |
|---|---|---|
| CN | 101493503 A | 7/2009 |
| CN | 102553838 A | 7/2012 |

(Continued)

*Primary Examiner* — Mohammad K Islam
(74) *Attorney, Agent, or Firm* — HSML P.C.

(57) ABSTRACT

The present invention provides a method and apparatus for measuring a battery impedance value. The following steps are executed: performing multiple pulse discharges on a battery in multiple different discharge time periods, and separately measuring multiple equivalent direct current resistance values of the battery; drawing an equivalent direct current resistance spectrum, the equivalent direct current resistance spectrum comprising a horizontal axis and vertical axis, the horizontal axis comprising the multiple different discharge time periods, and the vertical axis comprising the equivalent direct current resistance values corresponding to the different discharge time periods; obtaining equivalent circuit model parameter values of the battery according to the equivalent direct current resistance spectrum; and calculating the impedance value of the battery by an impedance calculation formula of a battery equivalent circuit according to the equivalent circuit model parameter values.

14 Claims, 7 Drawing Sheets

(56) References Cited

U.S. PATENT DOCUMENTS

| | | | |
|---|---|---|---|
| 2006/0186890 A1* | 8/2006 | Iwane | G01R 31/392 |
| | | | 324/426 |
| 2007/0052424 A1* | 3/2007 | Okumura | G01R 31/396 |
| | | | 324/432 |
| 2010/0201320 A1* | 8/2010 | Coe | H02J 7/0069 |
| | | | 320/136 |
| 2010/0250038 A1 | 9/2010 | Morita et al. | |
| 2014/0372054 A1* | 12/2014 | Wang | G01R 31/3842 |
| | | | 702/63 |
| 2014/0372055 A1* | 12/2014 | Wang | G01R 31/389 |
| | | | 702/63 |
| 2015/0288197 A1* | 10/2015 | Choi | H02J 7/005 |
| | | | 320/137 |
| 2015/0377978 A1* | 12/2015 | Mitsuyama | G01R 31/392 |
| | | | 702/63 |
| 2016/0003912 A1* | 1/2016 | Iwane | G01R 31/3648 |
| | | | 702/63 |
| 2016/0134146 A1* | 5/2016 | Ling | H01M 10/48 |
| | | | 320/136 |
| 2018/0059191 A1* | 3/2018 | Abu Qahouq | G01R 31/392 |
| 2019/0146038 A1* | 5/2019 | Matsumoto | B60L 3/12 |
| | | | 324/430 |
| 2021/0123977 A1* | 4/2021 | Boss | G01R 31/389 |
| 2022/0206076 A1* | 6/2022 | Morrison | G01R 31/3648 |
| 2024/0222721 A1* | 7/2024 | Ghantous | H02J 7/0047 |

FOREIGN PATENT DOCUMENTS

| | | |
|---|---|---|
| CN | 104849672 A | 8/2015 |
| CN | 107045109 A | 8/2017 |
| CN | 107656215 A | 2/2018 |
| CN | 109143108 A | 1/2019 |
| CN | 109856557 A | 6/2019 |
| CN | 109921493 A | 6/2019 |
| CN | 110165150 A | 8/2019 |
| CN | 110320474 A | 10/2019 |
| CN | 111736085 A | 10/2020 |
| CN | 112230153 A | 1/2021 |
| JP | H10221418 A | 8/1998 |
| JP | 2014238948 A | 12/2014 |
| WO | 2017159031 A1 | 9/2017 |

* cited by examiner

METHOD AND APPARATUS FOR MEASURING BATTERY IMPEDANCE VALUE

CROSS-REFERENCE TO RELATED APPLICATIONS

This application is a national stage entry of International Patent Application No. PCT/CN2021/123514, filed Oct. 10, 2013, entitled "METHOD AND APPARATUS FOR MEASURING BATTERY IMPEDANCE VALUE," which claims priority to Chinese Patent Application Serial No. 202011090591.8, filed Oct. 10, 2013, the disclosures of which are hereby incorporated by reference in their entirety.

TECHNICAL FIELD

The present invention mainly relates to the technical field of battery parameter measurement, in particular to a method and apparatus for measuring battery equivalent circuit model parameters and impedance values.

BACKGROUND

With the popularization of mobile communication products such as smartphones and laptops and the development of electric vehicles, batteries regarded as an electrochemical energy storage device will be widely used for a long time. In many applications, factors such as battery safety, aging degree, and charging capacity have been extensively studied. Battery equivalent circuit model parameters and impedances play a crucial role in these studies.

The battery equivalent circuit model is a commonly used model in battery testing and analysis, which can characterize each part of the battery through the electrical model of resistance and capacitance. FIG. 1a is a commonly used battery equivalent circuit model, including electromotive force $V_{OCV}$, electrolyte ohmic resistance $R_\Omega$, electric double layer capacitance $C_d$ and charge transfer resistance $R_{ct}$. According to the different internal structures of various types of batteries, the battery model is often extended by expanding the order of the R-C loop in the battery equivalent circuit for different types of batteries. For example, FIG. 1b is a commonly used equivalent circuit model of a lithium-ion battery; since there is a solid electrolyte interfacial (SEI) film on the electrode surface of the lithium-ion battery, a related R-C loop will be added to the battery model, so the equivalent circuit of the lithium-ion battery equivalent circuits often use the model of a two-order/double R-C loop as shown in FIG. 1b.

Among the battery model parameters, the electromotive force $V_{OCV}$ can be obtained by detecting the open circuit voltage of the battery, and the resistance and capacitance values closely related to the internal characteristics of the battery currently are mainly detected by the AC impedance method. The AC impedance method refers to controlling the current (or system electric potential) passing through an electrochemical system to change sinusoidally over time under small amplitude conditions, and simultaneously measuring the corresponding system electric potential (or current) changing with time, or directly measuring the AC impedance (or admittance) of the system, and then analyzing the reaction mechanism of the electrochemical system and calculating the relevant parameters of the system.

The AC impedance method regards the electrochemical system to be tested as a black box system, using a small-amplitude sinusoidal signal X as the disturbance signal, and the response signal Y is usually a sinusoidal signal with the same frequency. The relationship between Y and X is: $Y=G(\omega)X$. At this time, the system transfer function $G(\omega)$ is called the frequency response function, which is a function of the angular frequency $\omega$ and reflects the frequency response characteristics of the system. When the disturbance signal X is a sinusoidal current signal and the response signal Y is a sinusoidal potential signal, $G(\omega)$ is the system impedance, represented by Z; when the disturbance signal X is a sinusoidal potential signal and the response signal Y is a sinusoidal current signal, $G(\omega)$ is the system admittance, which is the reciprocal of impedance.

Electrochemical impedance spectrum is a curve drawn from electrochemical impedance data at different frequencies, and the most commonly used ones include impedance complex plane plots and Bode plots. The impedance complex plane plot draws a curve with the real part of the impedance as the horizontal axis and the imaginary part of the impedance as the vertical axis, also known as the Nyquist plot. The Bode plot is comprised of two curves, which respectively describe the variation relationship of the impedance magnitude according to frequency as well as the variation relationship of the impedance phase according to the frequency. Impedance complex plane plot and impedance Bode plot can be transformed into each other.

Taking the equivalent circuit of the single-order R-C model shown in FIG. 1a as an example, the battery impedance is:

$$Z = R_\Omega + \cfrac{1}{j\omega C_d + \cfrac{1}{R_{ct}}} \tag{1}$$

FIG. 2a is the AC impedance complex plane plot of the single R-C model (as shown in FIG. 1a). According to the relationship between impedance and R, C, $\omega$, the resistance values and capacitance values in the battery model can be obtained through the AC impedance complex plane plot. Similarly, FIG. 2b is the AC impedance complex plane plot of the double R-C model (as shown in FIG. 1b), and the resistance values and capacitance values in the relevant battery model can be obtained through the AC impedance spectrum.

When using the AC impedance method, it is necessary to measure the impedance value of the battery to different frequency signals, to draw the AC impedance spectrum curve, and then to obtain the above-mentioned equivalent circuit model parameters of each battery according to the AC impedance spectrum.

According to the AC impedance method, in the impedance test, it is necessary to ensure that the response signal of the electrochemical system to the input sinusoidal signal is a sinusoidal wave with the same frequency as the input signal, therefore, the system needs to satisfy causality, linearity and stability, resulting in a very small amplitude of the input signal for the electrochemical method. Therefore, the shortcomings of the AC impedance method for measuring the battery equivalent circuit model parameters and impedance mainly lie in the following two aspects.

With the improvement of battery capacity, the impedance of the battery becomes extremely small; therefore, AC impedance equipment is required to improve the test accuracy and processing capacity, which greatly increases the cost of the equipment, and the measurement results are not accurate enough.

In addition, in the field of high-voltage energy storage, such as the scene of electric vehicles, multiple batteries need to be connected in series, and the AC impedance method can only detect the impedance spectrum of a single battery at one time, so it cannot meet the requirements of online real-time detection of multiple batteries.

SUMMARY

The technical problem to be solved by the present invention is to provide a method and apparatus for measuring battery impedance value, applying which the detection accuracy of battery equivalent circuit model parameter values and impedance values, the application range, and the real-time capability can be improved, thereby more effectively and accurately evaluating the service life and performance of batteries can be achieved.

In order to solve the above technical problems, the present application provides a method for measuring a battery impedance value, comprising: performing multiple pulse discharges on a battery in multiple different discharge time periods, and separately measuring multiple equivalent direct current resistance values of the battery; drawing an equivalent direct current resistance spectrum, the equivalent direct current resistance spectrum comprising a horizontal axis and a vertical axis, the horizontal axis comprising the multiple different discharge time periods, and the vertical axis comprising the equivalent direct current resistance values corresponding to the different discharge time periods; obtaining equivalent circuit model parameter values of the battery according to the equivalent direct current resistance spectrum; and calculating an impedance value of the battery by an impedance calculation formula of a battery equivalent circuit according to the equivalent circuit model parameter values.

In one embodiment of the present invention, performing multiple pulse discharges on a battery in multiple different discharge time periods, and separately measuring multiple equivalent direct current resistance values of the battery further comprises: measuring a normal voltage of the battery; providing a discharge current and a discharge time, and the battery performs the pulse discharges according to the discharge current and the discharge time; measuring a battery voltage at an end of the pulse discharges of the battery, and calculating a voltage difference according to the normal voltage; calculating the equivalent direct current resistance values of the battery at the discharge time based on the voltage difference and the discharge current; and changing the discharge time, repeating above steps of measuring the equivalent direct current resistance values of the battery, so as to obtain the equivalent direct current resistance values corresponding to the multiple different discharge time periods.

In one embodiment of the present invention, a value range of the pulse discharge time periods is 1 μs~1 s.

In one embodiment of the present invention, obtaining the equivalent circuit model parameter value further comprises: obtaining a battery ohmic resistance value $R_\Omega$, an electric double layer capacitance value $C_d$ and a charge transfer resistance $R_{ct}$.

In one embodiment of the present invention, obtaining the equivalent circuit model parameter value of the battery according to the equivalent direct current resistance spectrum further comprises: fitting the equivalent direct current resistance spectrum to an e-exponential function, and a junction point between a fitting curve and an ordinate is the battery ohmic resistance value $R_\Omega$; subtracting the battery ohmic resistance value $R_\Omega$ from a maximum ordinate value (saturation value for fitting e exponential function) of the equivalent direct current resistance spectrum to obtain the charge transfer resistance $R_{ct}$; and determining a discharge time constant according to an e-exponential fitting curve, and calculating the electric double layer capacitance value $C_d$ according to the discharge time constant and the charge transfer resistance $R_{ct}$.

In one embodiment of the present invention, when the battery is a lithium battery, obtaining the equivalent circuit model parameter values of the battery further comprises: obtaining a solid electrolyte interfacial film resistance value $R_{SEI}$ and a solid electrolyte interfacial film capacitance value $C_{SEI}$.

In one embodiment of the present invention, obtaining the equivalent circuit model parameter value of the battery according to the equivalent direct current resistance spectrum further comprises: fitting a high frequency part of the equivalent direct current resistance spectrum to an e-exponential function, and a junction point between a fitting curve and an ordinate is the battery ohmic resistance value $R_\Omega$; subtracting the battery ohmic resistance value $R_\Omega$ from a median ordinate value (saturation value for fitting e exponential function at high frequency) of the equivalent direct current resistance spectrum to obtain the solid electrolyte interfacial film resistance value $R_{SEI}$; determining a first discharge time constant according to a high frequency e-exponential fitting curve, and calculating the solid electrolyte interfacial film capacitance value $C_{SEI}$ according to the first discharge time constant and the solid electrolyte interfacial film resistance value $R_{SEI}$; fitting a low frequency part of the equivalent direct current resistance spectrum to the e-exponential function, subtracting the battery ohmic resistance $R_\Omega$ and the solid electrolyte interfacial film resistance $R_{SEI}$ from a maximum value (saturation value for fitting e exponential function at low frequency) of the ordinate to obtain the charge transfer resistance $R_{ct}$; and determining a second discharge time constant according to a low frequency e-exponential fitting curve, and calculating the electric double layer capacitance value $C_d$ according to the second discharge time constant and the charge transfer resistance $R_{ct}$.

In one embodiment of the present invention, when the battery includes a multiple battery cells connected in series, performing a multiple pulse discharges on a battery in a multiple different discharge time periods, and separately measuring a multiple equivalent direct current resistance values of the battery further comprises: during each pulse discharge of the multiple pulse discharge, performing pulse discharge on each battery cell with the same discharge current and discharge time to obtain the equivalent direct current resistance value of each battery cell.

In order to solve the above technical problems, the present application provides an apparatus for measuring a battery impedance value, comprising a battery and an impedance measurement circuit, and the impedance measurement circuit comprising a conductive path connected to a positive terminal and a negative terminal of the battery, wherein the impedance measurement circuit comprises: a power supply unit, comprising a direct current power supply and a pulse control switch configured to provide a different discharge time periods and a discharge currents to a pulse discharge of the battery; a voltage detector, configured to measure a voltage across the battery, the voltage including a normal voltage and a battery voltage at the end of the pulse discharge; and a control unit, configured to collect the voltage, calculating a multiple equivalent direct current resistance values and drawing an equivalent direct current resistance spectrum of the battery, and obtaining an equivalent circuit model parameter of the battery and calculating an impedance value of the battery according to the equivalent direct current resistance spectrum.

In one embodiment of the apparatus for measuring a battery impedance value of the present invention, the equivalent circuit model parameter values comprises: a battery ohmic resistance value $R_\Omega$, an electric double layer capacitance value $C_d$ and a charge transfer resistance $R_{ct}$.

In one embodiment of the apparatus for measuring a battery impedance value of the present invention, when the battery is a lithium battery, the equivalent circuit model parameter values of the battery further comprises a solid electrolyte interfacial film resistance value $R_{SEI}$ and a solid electrolyte interfacial film capacitance value $C_{SEI}$.

In one embodiment of the apparatus for measuring a battery impedance value of the present invention, the battery comprises a multiple battery cells connected in series, and both ends of each battery cell are connected to a voltage detector, a control unit is configured to separately obtain the equivalent circuit model parameter values of each battery cell, and calculating the impedance value of each battery cell respectively.

Another aspect of the present invention also provides a system for measuring battery impedance values, comprising: a memory unit, configured to store instructions to be executed by a processor; and a processor, configured to execute the instructions to realize the method for measuring battery impedance values.

Another aspect of the present invention also provides a computer-readable medium storing computer program codes, wherein the computer program codes implements the method for measuring battery impedance values when executed by a processor.

Compared with the prior art, the present invention has the following advantages.

The present invention only uses the pulse current as the detection signal, reducing the accuracy and processing capacity of the equipment required for measuring battery impedance values, and thus reducing the detection cost.

The method and apparatus for measuring battery impedance values of the present invention can change the size of the test current according to the capacity of the tested battery, and obtain an equivalent direct current internal resistance; for example, in a complex electromagnetic environment such as an electric vehicle, increasing the test current can obtain good signal-to-noise ratio, improving detection accuracy.

The method and apparatus for measuring battery impedance values of the present invention are suitable for simultaneously measuring and monitoring the respective impedance values of multiple series-connected battery cells, not only improving the detection accuracy, but also improving the application range and real-time capability of the method for measuring battery impedance values.

BRIEF DESCRIPTION OF THE DRAWINGS

The drawings are included to provide a further understanding of the present application, and they are included and constitute a part of the present application, the drawings show the embodiments of the present application, explaining the principle of the present invention together with the description. In the drawing.

PREFERRED EMBODIMENT OF THE PRESENT INVENTION

Figure 1A:
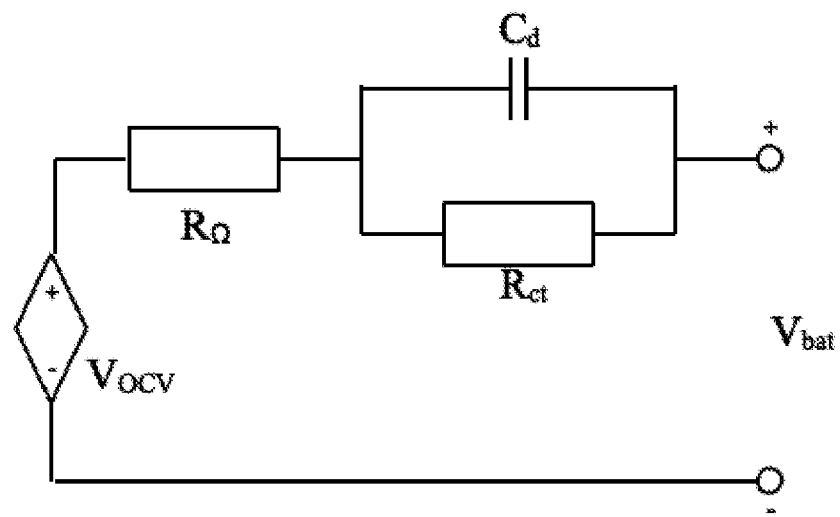
FIG. 1a and FIG. 1b are equivalent circuit diagrams of two types of batteries.

In order to illustrate the technical solutions in the embodiments of the present application more clearly, the drawings that need to be used in the description of the embodiments will be briefly introduced below. Obviously, the drawings in the following description are only some embodiments of the present application, and for those skilled in the art, other drawings can also be obtained based on these drawings without creative effort.

As indicated in this application and claims, the terms "a", "an", "a kind of" and/or "the" do not specifically refer to the singular and may include the plural unless the context clearly indicates an exception. Generally speaking, the terms "comprising" and "including" only suggest the inclusion of clearly identified steps and elements, and these steps and elements do not constitute an exclusive list, and the method or device may also contain other steps or elements.

The relative arrangements of components and steps, numerical expressions and numerical values set forth in these embodiments do not limit the scope of the present application unless specifically stated otherwise. At the same time, it should be understood that, for the convenience of description, the sizes of the various parts shown in the drawings are not drawn according to the actual proportional relationship. Techniques, methods and devices known to those of ordinary skill in the relevant art may not be discussed in detail, but where appropriate, such techniques, methods and devices should be considered part of the authorized specification. In all embodiments shown and discussed herein, any specific values should be construed as illustrative only, and not as limiting. Therefore, other examples of the exemplary embodiment may have different values. It should be noted that like numerals and letters denote like items in the following figures, therefore, once an item is defined in one figure, it does not require further discussion in subsequent drawings.

In the description of the present application, it should be understood that orientation words such as "front, back, up, down, left, right", "landscape, portrait, vertical, horizontal" and "top, bottom" etc. indicating the orientation or positional relationship is generally based on the orientation or positional relationship shown in the drawings, only for the convenience of describing the application and simplifying the description, in the absence of a contrary statement, these orientation words do not indicate or imply that the device or element referred to must have a specific orientation or be constructed and operated in a specific orientation, and therefore cannot be construed as limiting the scope of protection of this application; the orientation words "inside and outside" refer to inside and outside relative to the outline of each part itself.

For the convenience of description, spatially relative terms may be used here, such as "on . . . ", "over . . . ", "on the upper surface of . . . ", "above", etc., to describe the spatial positional relationship between one device or feature and other devices or features. It will be understood that, in addition to the orientation depicted in the drawings, the spatially relative terms are intended to encompass different orientations of the device in use or operation. For example, if the device in the drawings is turned over, devices described as "on other devices or configurations" or "above other devices or configurations" would then be oriented "beneath other devices or configurations" or "under other devices or configurations". Thus, the exemplary term "above" can encompass both an orientation of "above" and "beneath". The device may be otherwise oriented (rotated 90 degrees or at other orientations), and making a corresponding explanation for the space relative description used here.

In addition, it should be noted that the use of words such as "first" and "second" to define components is only for the convenience of distinguishing corresponding components, unless otherwise stated, the above words have no special meanings, and therefore cannot be construed as limiting the protection scope of the present application. In addition, although the terms used in this application are selected from well-known and commonly used terms, some terms mentioned in the specification of this application may be selected by the applicant according to his or her judgment, and their detailed meanings are listed in this article described in the relevant section of the description. Furthermore, it is required that this application be understood not only by the actual terms used, but also by the meaning implied by each term.

It will be understood that when an element is referred to as being "on," "connected to," "coupled to" or "in contacting with" another element, it can be directly on, connected to, coupled to, or in contact with the other element, or there may be an intervening component. In contrast, when an element is referred to as being "directly on," "directly connected to," "directly coupled to" or "directly in contacting with" another element, there are no intervening elements present. Likewise, when a first component is referred to as being "electrically contacting" or "electrically coupled to" a second component, there exists an electrical path between the first component and the second component that allows electrical current to flow. This electrical path may include capacitors, coupled inductors, and/or other components that allow current to flow, even without direct contact between conductive components.

In one embodiment of the present invention it provides a method for equivalent circuit model parameter values and battery impedance value, applying which the detection accuracy of battery equivalent circuit model parameter values and impedance values, the application range, and the real-time capability can be improved, thereby more effectively and accurately evaluating the service life and performance of batteries are achieved.

Figure 3:
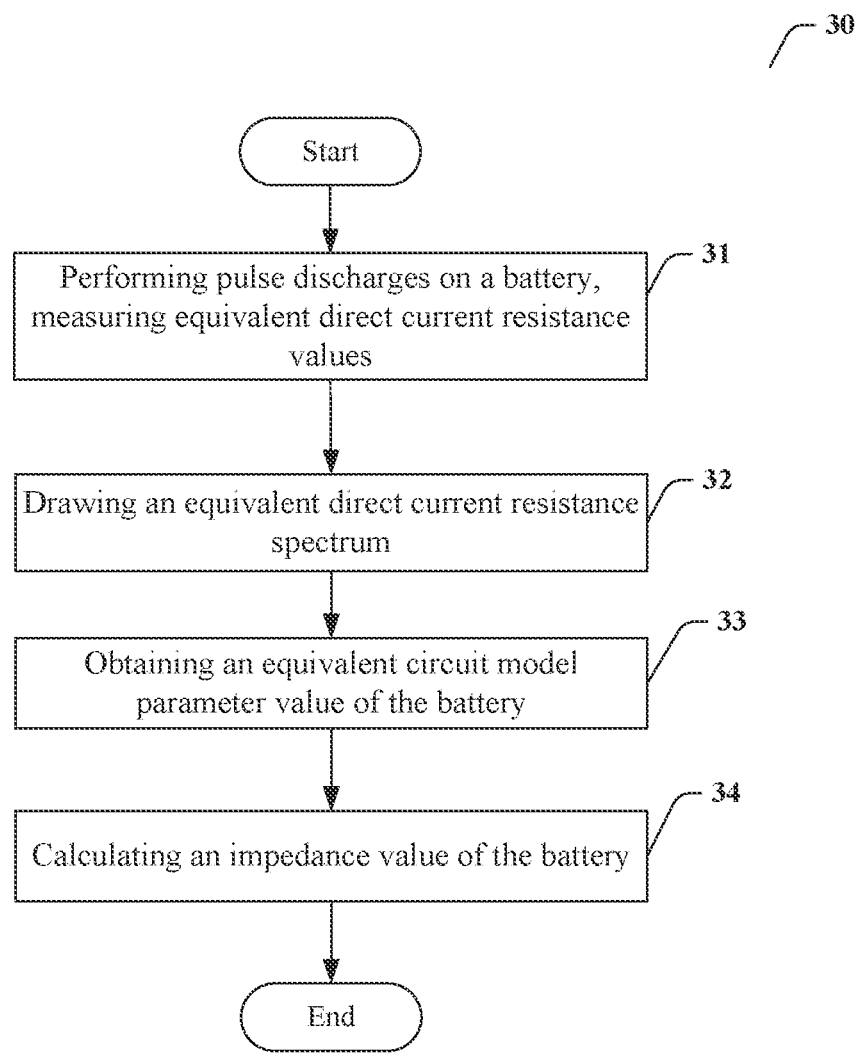
FIG. 3 is a schematic flowchart of a method for measuring battery impedance values according to an embodiment of the present invention.

FIG. 3, shows a schematic flowchart of a method for measuring battery impedance values according to an embodiment of the present invention. FIG. 3 uses a flowchart to illustrate the operations performed by the system according to the embodiment of the present application. It should be understood that the preceding or following operations are not necessarily performed in an exact order. Instead, various steps may be processed in reverse order or simultaneously. At the same time, other operations are either added to these procedures, or a certain step or steps can be removed from these procedures.

Figure 4:
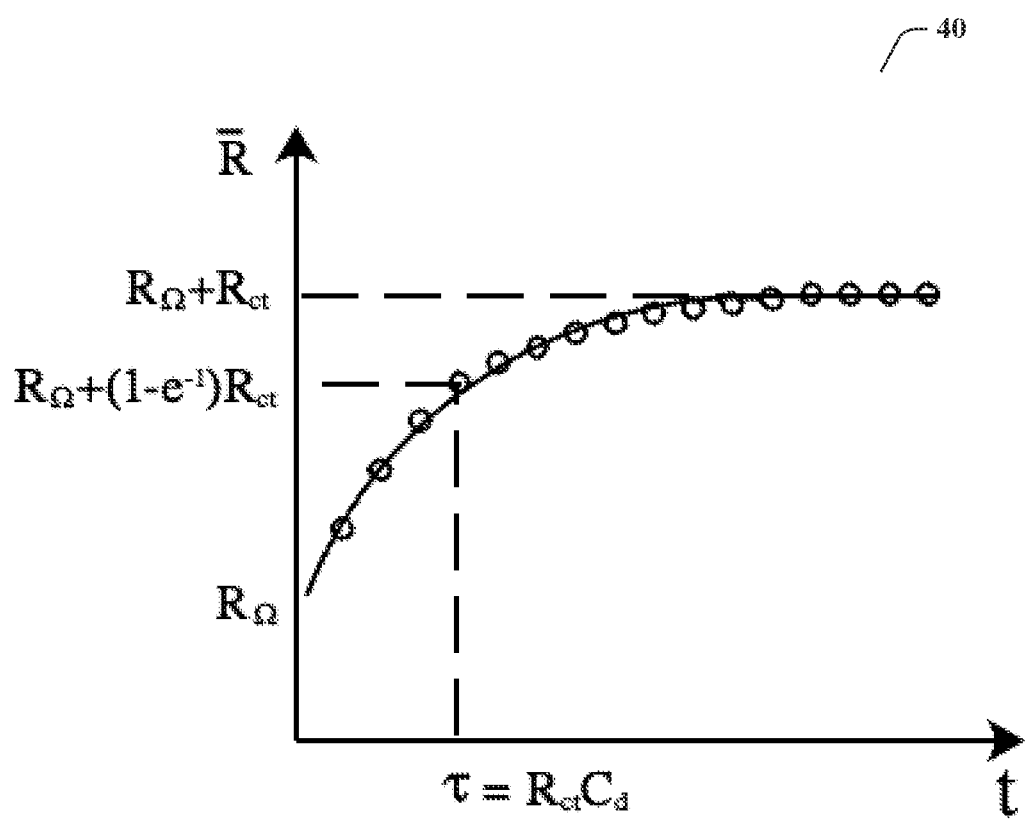
FIG. 4 is the equivalent direct current resistance spectrum drawn in the method for measuring battery impedance values according to an embodiment of the present invention.
Figure 5:
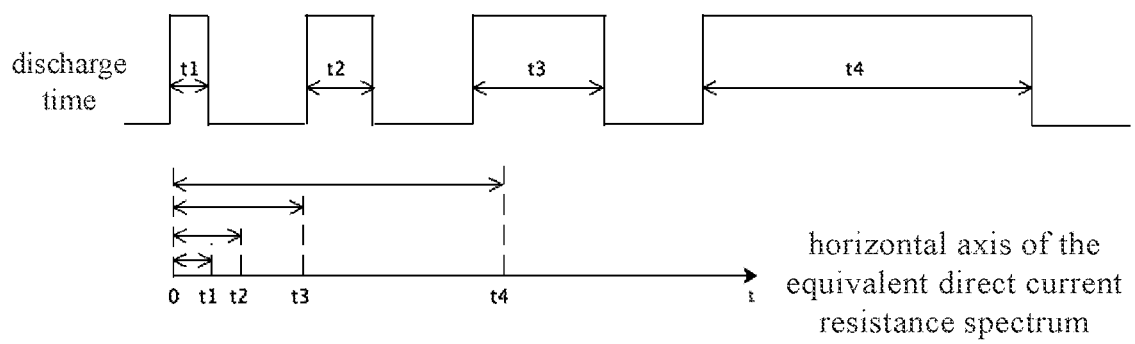
FIG. 5 is a schematic view of the horizontal axis coordinates of the equivalent direct current resistance spectrum corresponding to the pulse discharge time in the method for measuring the battery impedance values according to an embodiment of the present invention.
Figure 6:
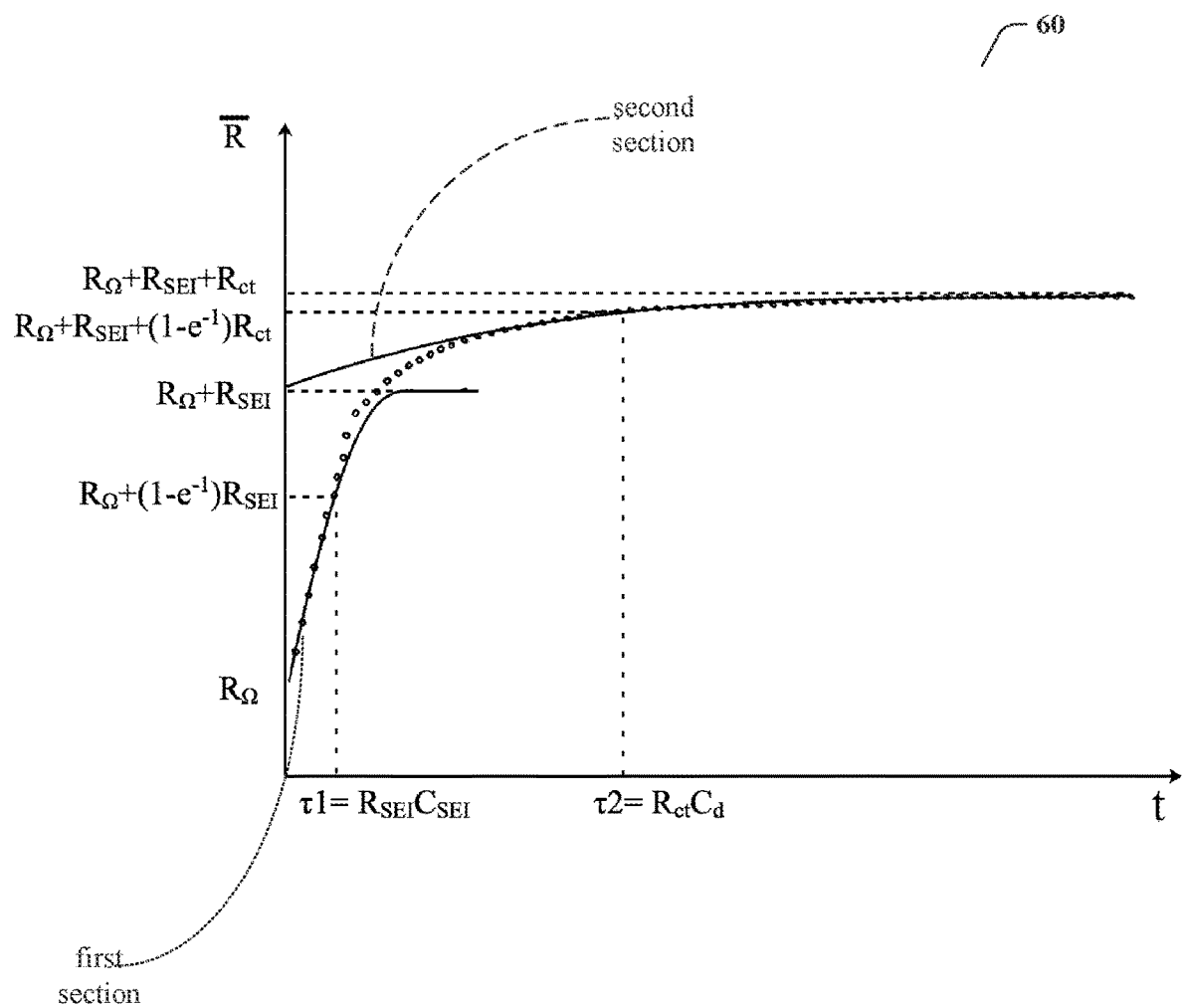
FIG. 6 is an equivalent direct current resistance spectrum drawn in the method for measuring battery impedance value according to another embodiment of the present invention.

FIG. 4 is the equivalent direct current resistance spectrum 40 drawn in the method 30 for measuring battery impedance values according to the step 32 in FIG. 3. FIG. 5 is a schematic view of the horizontal axis coordinates of the equivalent direct current resistance spectrum corresponding to the pulse discharge time in the method for measuring the battery impedance values according to an embodiment of the present invention; FIG. 6 is an equivalent direct current resistance spectrum 60 drawn in the method 30 for measuring battery impedance values according to the step 32 in FIG. 3 in another embodiment of the present invention. The method 30 for measuring the battery impedance values according to an embodiment of the present invention will be described below with reference to FIG. 3-6.

As shown in FIG. 3, step 31 is performing pulse discharge on a battery and measuring equivalent direct current resistance value. Specifically, step 31 is performing multiple pulse discharges on a battery under multiple different discharge time periods, and respectively measuring multiple equivalent direct current resistance values of the battery corresponding to different discharge time periods.

In one embodiment of the present invention, the method of measuring and calculating the said equivalent direct current resistance value $\overline{R}$ is as followed:

when the battery is not pulse-discharged, measuring the normal voltage at both ends of the battery;

providing a certain discharge current and discharge time t, and the battery performs pulse discharge within the given discharge current and discharge time period t; exemplarily, the pulse discharge current can apply a smaller value of excitation current, the reference range can be several milliamperes to several amperes, and the discharge time period t can be selected between 1 μs~1 s;

measuring the battery voltage at the end of the battery pulse discharge, and do subtracting together with the above-mentioned normal voltage to calculate the voltage difference;

calculating the ratio of the voltage difference and the discharge current to obtain the equivalent direct current resistance value $\overline{R}$ of the tested battery at the specific discharge time period t; and changing the discharge time period t, and repeating the above steps for measuring the equivalent direct current resistance value $\overline{R}$ of the battery, in order to obtain multiple equivalent direct current resistance values $\overline{R}$ corresponding to multiple different discharge time periods t.

Those skilled in the art can understand that when the current I flows through the single R-C equivalent circuit model shown in FIG. 1a, the current I is divided into the current $I_C$ of the capacitor C and the current $I_R$ of the resistor R. Due to the characteristic of the R-C equivalent circuit model, the $I_C$ decays exponentially with time. This results in the voltage across the R-C network as a function of time for the pulse width $t_p$ as follows:

$$U(t_p) = R*I_R = R*(I - I_C) = R*I\left(1 - e^{-\frac{t_p}{\tau}}\right) \quad (2)$$

τ is the time constant of the R-C equivalent circuit model, specifically the product of R and C. The value of the equivalent direct current internal resistance $\overline{R}$ based on the R-C equivalent circuit model is:

$$\overline{R} = \frac{U(t_p)}{I} = R\left(1 - e^{-\frac{t_p}{\tau}}\right) = \int_0^{t_p} \frac{R}{\tau} e^{-\frac{t}{\tau}} dt = \int_0^{t_p} \left(\frac{R}{\tau} e^{-\frac{t}{\tau}}\right) u(t) dt. \quad (3)$$

u(t) is the unit step function:

$$u(t) = \begin{cases} 0 & t < 0 \\ 1 & t \geq 0 \end{cases}. \quad (4)$$

further Fourier transform of the function in the integral can obtain:

$$\mathcal{F}\left[\left(\frac{R}{\tau} e^{-\frac{t}{\tau}}\right) u(t)\right] = \int_{-\infty}^{+\infty} \left\{\left[\left(\frac{R}{\tau} e^{-\frac{t}{\tau}}\right) u(t)\right] e^{-j\omega t}\right\} dt = \frac{1}{j\omega C + \frac{1}{R}}. \quad (5)$$

This is the expression of the RC network impedance in the frequency domain space, which proves that the equivalent direct current internal resistance in the present invention is essentially the performance of the RC network impedance in the time domain space. This constitutes the theoretical basis for obtaining battery impedance through equivalent direct current internal resistance in the present invention.

As shown in FIG. 3, step 32 is drawing an equivalent direct current resistance spectrum. Exemplarily, after the measuring and calculating in step 31, the battery equivalent direct current resistance values $\overline{R}$ corresponding to multiple different discharge time periods t can be obtained; based on these discrete values, the equivalent resistance spectrum 40 of the battery as shown in FIG. 4 can be plotted with the discharge time period t as the abscissa and the battery's equivalent direct current resistance $\overline{R}$ as the ordinate.

Exemplarily, regarding the drawing method of the equivalent resistance spectrum 40 of the battery, first, as shown in FIG. 5, the abscissas t1, t2, t3 . . . are determined sequentially according to the positional relationship from near to far from the origin in the equivalent resistance spectrum 40, and then according to the measured and calculated equivalent direct current resistance values $\overline{R}_1$, $\overline{R}_2$, $\overline{R}_3$ . . . of the battery at different discharge time periods t, determining their respective positions in the two-dimensional coordinate system shown in FIG. 4 (indicated by circle points in FIG. 4). Thus, the horizontal axis of the equivalent resistance spectrum 40 includes different discharge time periods t, and the vertical axis includes equivalent direct current resistance values $\overline{R}$ corresponding to different discharge time periods t.

As shown in FIG. 3, step 33 is obtaining an equivalent circuit model parameter value of the battery.

As for the battery of the single R-C equivalent circuit model according to FIG. 1a, the equivalent circuit model parameter values obtained from step 33 comprising, battery ohmic resistance value $R_\Omega$, electric double layer capacitance value $C_d$ and charge transfer resistance $R_{ct}$.

Specifically, according to the equivalent resistance spectrum 40 shown in FIG. 4, the steps of obtaining the above-mentioned equivalent circuit model parameter values include:

according to the discrete points in the two-dimensional coordinate system determined by the above steps 31 and 32 in the equivalent direct current resistance spectrum 40, each point of the equivalent direct current resistance spectrum 40 can be fitted with an e-exponential function, and the intersection point of the fitting curve (represented as a solid line in FIG. 4) and the ordinate is the battery ohmic resistance value $R_\Omega$;

subtracting the battery ohmic resistance value $R_\Omega$ from the maximum value of the ordinate of the equivalent direct current resistance spectrum 40 (that is, the saturation value of the fitting e-exponential function) to obtain the charge transfer resistance $R_{ct}$; and the discharge time constant τ is determined according to the battery e-exponential fitting curve, and the electric double layer capacitance $C_d$ is calculated according to the discharge time constant and the charge transfer resistance $R_{ct}$.

In order to better understand the theoretical basis for the implementation of the solution of the present invention, a brief introduction will be given below to the method for calculating the above-mentioned equivalent circuit model parameter values through FIG. 4.

Different from the method of measuring impedance in the frequency domain by AC impedance spectrum, the equivalent direct current resistance spectrum 40 shown in FIG. 4 directly measures resistance value in the time domain. This method adopts the pulse current I to discharge the battery; the pulse discharge time is t, and the various of the battery voltage ΔV at the end of the pulse signal is measured, then the equivalent direct current resistance value of the battery at this moment is:

$$\overline{R}(t) = \frac{\Delta V(t)}{I} = R_\Omega + R_{ct}\left(1 - e^{-\frac{t}{\tau}}\right) \quad (6)$$

This indicates that the equivalent direct current resistance value $\overline{R}$ is a function of time t. When the pulse time t is long enough, there is no difference between the equivalent direct current resistance value $\overline{R}$ and the general battery internal resistance test value, which is the sum of $R_\Omega$ and $R_{ct}$. However, as the pulse time shortens, the parameter information in the equivalent circuit model inside the battery will be expressed through the equivalent direct current resistance value $\overline{R}$. In particular, when the pulse discharge time period t is close to the internal R-C time constant τ of the battery, the equivalent direct current resistance value $\overline{R}$ in the R-C equivalent circuit model will appear to decay in accordance with the time constant exponential e.

Based on the theoretical support mentioned above, and referring to the single R-C equivalent circuit model of the battery as shown in FIG. 1a, when the pulse discharge time is infinitely close to 0, the electric double layer capacitance $C_d$ at this time is in the high-frequency conduction stage. When the charge transfer resistance $R_{ct}$ is short-circuited, the battery equivalent direct current resistance value $\overline{R}$ is the battery ohmic resistance value $R_\Omega$, therefore, the intersection point of the e-exponential function fitting curve of each discrete point of the equivalent direct current resistance spectrum 40 and the vertical axis of is the battery ohmic resistance $R_\Omega$.

When the discharge time period t of the pulse is long enough, the electric double layer capacitance $C_d$ is in a saturated state, which is equivalent to an open circuit, and the equivalent direct current resistance $\overline{R}$ is the sum of the battery ohmic resistance $R_\Omega$ and the charge transfer resistance $R_{ct}$. Therefore, the charge transfer resistance $R_{ct}$ can be obtained by subtracting the battery ohmic resistance value $R_\Omega$ from the maximum value of the ordinate of the equivalent direct current resistance spectrum 40 (the saturation value of the fitting e-exponential function).

Further, when the pulse discharge time is between time zero and the saturation state of the electric double layer capacitance $C_d$, the equivalent direct current resistance spectrum 40 exhibits e-exponential function characteristics. According to the obtained e-exponential fitting curve function (e value is about 2.718), the time constant $\tau$ can be determined. The time constant $\tau$ can also be directly obtained through the equivalent direct current resistance spectrum, the method of which is as follows: when the discharge time period t is the discharge time constant $\tau$ of R-C (that is, t=$\tau$), the battery equivalent direct current resistance value can be known from the formula (6) $\overline{R}(\tau) = R_\Omega + R_{ct}(1-e^{-1})$. Finding the abscissa corresponding to the equivalent direct current resistance value $\overline{R}(\tau)$ in the direct current resistance spectrum 40, it is the time constant $\tau$. Since the time constant $\tau$ is equal to the product of the charge transfer resistance $R_{ct}$ and the electric double layer capacitance $C_d$, the electric double layer capacitance $C_d$ can be calculated based on the known charge transfer resistance $R_{ct}$.

As shown in FIG. 3, step 34 is calculating and obtaining the battery impedance value according to the impedance calculation formula of the battery equivalent circuit on the basis that the equivalent circuit model parameters values of the battery are known.

Exemplarily, under the equivalent circuit model of a single R-C battery as shown in FIG. 1a, the battery impedance value is:

$$Z = R_\Omega + \frac{1}{j\omega C_d + \frac{1}{R_{ct}}}$$

wherein, $R_\Omega$, $R_{ct}$ and $C_d$ are measured and calculated by steps 31 to 33 of method 30 for measuring the battery impedance value as shown in FIG. 3 of the present invention; j is an imaginary number symbol, $j^2=-1$; $\omega$ is the angular frequency of the input signal at both ends of the battery, and by bringing in different angular frequency values of the input signals, the battery impedance values for input signals of different angular frequencies can be obtained.

According to the obtained $R_\Omega$, $R_{ct}$, $C_d$ and battery impedance values, the battery life and performance can be further evaluated.

Figure 1B:
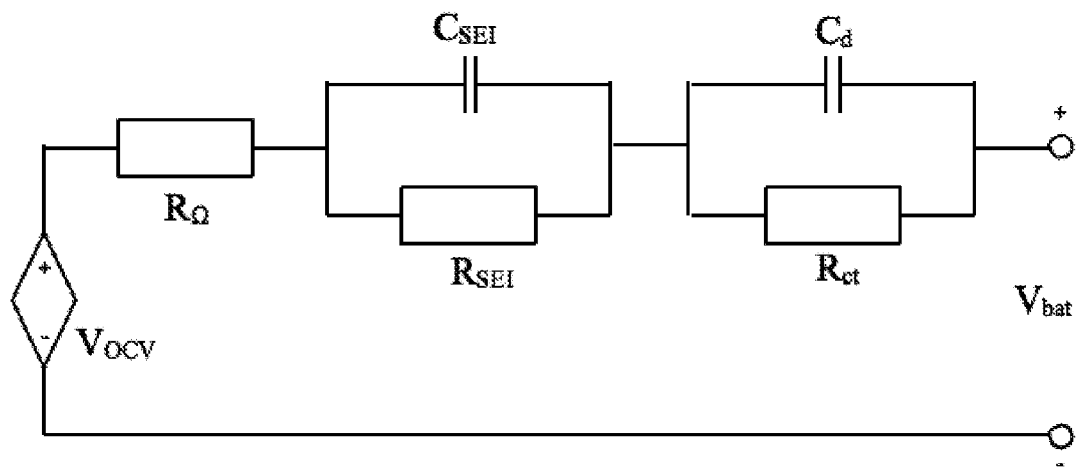
Figure 2A:
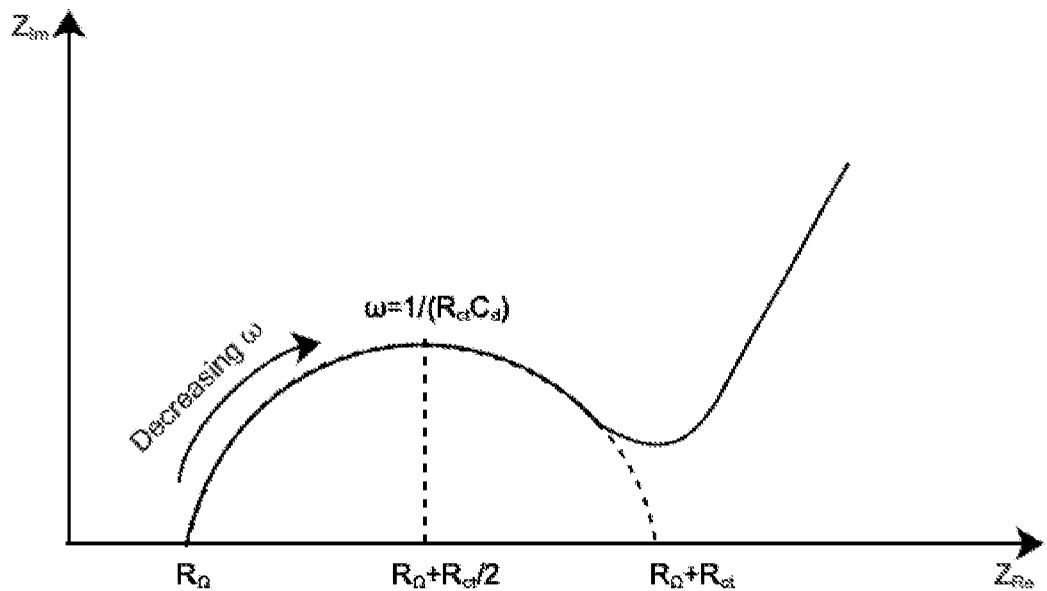
FIG. 2a and FIG. 2b are equivalent circuit model impedance complex plane plot corresponding to the two types batteries shown in FIG. 1a and FIG. 1b.
Figure 2B:
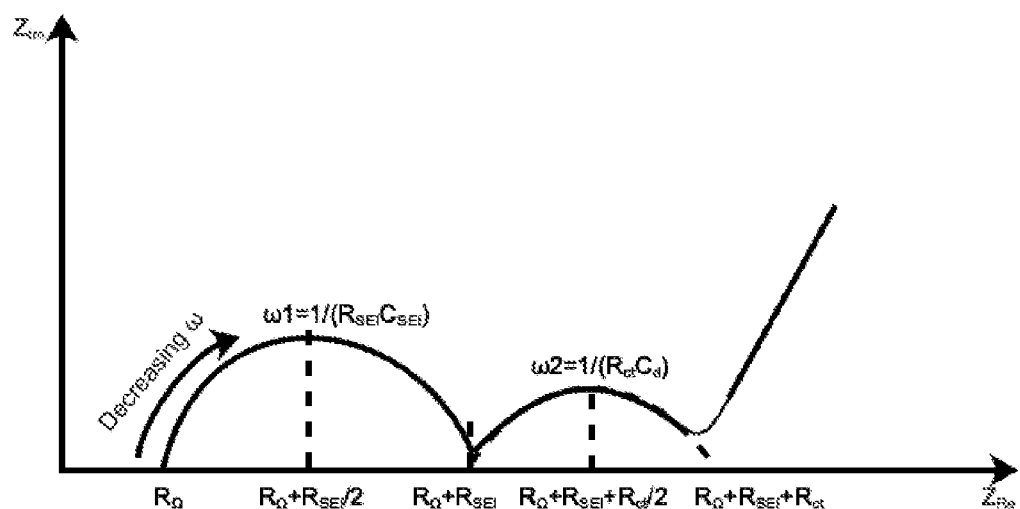

In another embodiment of the present invention, the tested battery is a lithium-ion battery, those skilled in the art can understand that the equivalent circuit model of a lithium-ion battery is a double R-C equivalent circuit model as shown in FIG. 1b. The method 30 for measuring the battery equivalent circuit model parameters of an embodiment of the present invention as shown in FIG. 3 can be applied for the measuring and calculating of the equivalent circuit model parameter values and battery impedance values of lithium-ion batteries, and based on the calculation of the above-mentioned single R-C equivalent circuit model, the following changes shall be made.

As shown in FIG. 3, step 31 is still performing pulse discharges on a battery, measuring the equivalent direct current resistance $\overline{R}$ to obtain multiple equivalent direct current resistance $\overline{R}$ corresponding to the discharge time period t of different pulses.

Step 32 is still drawing the equivalent direct current resistance spectrum. Different from the single R-C equivalent circuit model, according to the above theory which is similar to the single R-C equivalent circuit model, the function of the time and the battery equivalent direct current resistance value of the double R-C equivalent circuit model of the lithium-ion battery can be obtained:

$$\overline{R}(t) = \frac{\Delta V(t)}{I} = R_\Omega + R_{SEI}\left(1 - e^{-\frac{t}{\tau_1}}\right) + R_{ct}\left(1 - e^{-\frac{t}{\tau_2}}\right)$$

It can be seen that the equivalent resistance spectrum of the battery drawn based on the double R-C equivalent circuit model should have two interval graphs respectively in the high frequency section (corresponding to short discharge time) and low frequency section (corresponding to long discharge time).

As shown in FIG. 6, based on the equivalent direct current resistance spectrum 60 of the double R-C battery equivalent circuit model, the first section of the spectrum is presented in the area where the abscissa discharge time period t is close to the origin, and the second section is presented in the area far from the origin. Exemplarily, the discharge time period of the first section may be 0.1 ms~10 ms, which is within high frequency region, and the discharge time period of the second section may be 10 ms~500 ms, which is within low frequency region.

For other methods of obtaining multiple equivalent direct current resistance values $\overline{R}$ corresponding to different discharge time periods t, and details of drawing the equivalent direct current resistance spectrum 60, reference can be made to the above description about drawing the spectrum 40, which will not be repeated in this part.

Step 33 is still obtaining an equivalent circuit model parameter value of the battery. Different from the single R-C equivalent circuit model, according to the double R-C battery equivalent circuit model shown in FIG. 1b, when the battery is a lithium battery, except from the battery ohmic resistance $R_\Omega$, electric double layer capacitance $C_d$ and charge transfer resistance $R_{ct}$, the obtained battery equivalent circuit model parameter values further include the solid electrolyte interfacial film resistance $R_{SEI}$ and the solid electrolyte interfacial film capacitance $C_{SEI}$.

Specifically, according to the equivalent resistance spectrum 60 shown in FIG. 6, the steps of obtaining the above-mentioned equivalent circuit model parameter values comprises:

the first section of the equivalent direct current resistance spectrum 60 is fitted with a high-frequency e-exponential function, and the ordinate of the intersection point of the fitting curve (indicated by the first solid line in FIG. 6) and the vertical axis is the battery ohmic resistance value $R_\Omega$;

determining the maximum value of the first section of the spectrum (the saturation value of the high-frequency fitting e-exponential function), that is, $R_\Omega + R_{SEI}$, which is defined as the middle value of the spectrum 60, subtracting the battery ohmic resistance value $R_\Omega$ from the middle value to obtain a solid electrolyte interface film resistance value $R_{SEI}$;

the first discharge time constant $\tau 1$ can be determined according to the high-frequency e-exponential fitting function; the first discharge time constant τ1 can also be obtained directly through the equivalent direct current resistance spectrum, the methods are as follows: when the discharge time period t is the first discharge time constant τ1, $\overline{R}(\tau1)=R_\Omega+R_{SEI}(1-e^{-1})$, wherein e is the natural index, and the abscissa corresponding to $\overline{R}(\tau1)$ found in the spectrum 60 is the first discharge time constant τ1; since the time constant τ1 is the product of the solid electrolyte interface film resistance value $R_{SEI}$ and the solid electrolyte interfacial film capacitance value $C_{SEI}$, the solid electrolyte interfacial film capacitance value $C_{SEI}$ can be calculated when $R_{SEI}$ is known;

the second section of the equivalent direct current resistance spectrum 60 is fitted with a low-frequency e-exponential function, and the fitting curve (indicated by the second section of the solid line in FIG. 6) intersects with the ordinate of the intersection point of the vertical axis and $R_\Omega+R_{SEI}$;

determining the maximum value of the second section of the spectrum (the saturation value of the low-frequency fitting e-exponential function), that is, $R_\Omega+R_{SEI}+R_{ct}$, which is the maximum value of the spectrum 60, and subtracting the battery ohmic resistance value $R_\Omega$ and the solid electrolyte interface film resistance value $R_{SEI}$ from the maximum value to obtain the charge transfer resistance $R_{ct}$; and the second discharge time constant τ2 can be determined according to the low-frequency e-exponential fitting function; the second discharge time constant τ2 can also be directly obtained through the equivalent direct current resistance spectrum, the method is as follows: when the discharge time period t is the second discharge time constant τ2, $\overline{R}(\tau2)=R_\Omega+R_{SEI}+R_{ct}(1-e^{-1})$, the abscissa corresponding to $\overline{R}(\tau2)$ found in the spectrum 60 is the second discharge time constant τ2; since the time constant τ2 is the product of the electric double layer capacitance $C_d$ and the charge transfer resistance $R_{ct}$, the electric double layer capacitance $C_d$ can be calculated when $R_{ct}$ is known.

On the basis of obtaining the above-mentioned double R-C equivalent circuit model parameters values, step 34 as shown in FIG. 3 can be continued to conduct in order to calculate the impedance value of the lithium battery:

$$Z = R_\Omega + \frac{1}{j\omega C_{SEI} + \frac{1}{R_{SEI}}} + \frac{1}{j\omega C_d + \frac{1}{R_{ct}}}$$

wherein, $R_\Omega$, $R_{ct}$, $C_d$, $R_{SEI}$ and $C_{SEI}$ are the battery equivalent circuit model parameters values measured and calculated by the method 30 for measuring the battery impedance value shown in FIG. 3 of the present invention; j is an imaginary number symbol, $j^2=-1$; ω is the angular frequency of the input signal at both ends of the battery, by bringing in different angular frequency values of the input signal, the impedance value of the lithium battery with input signals of different angular frequencies can be obtained.

The above is the measuring and calculating method of the battery equivalent circuit parameter value shown in FIG. 3 of an embodiment of the present invention. It can be understood that the present invention does not limit the number of discrete points and determined order when drawing the equivalent direct current resistance spectrum in step 32.

The final purpose of drawing the equivalent direct current resistance spectrum in step 32, as mentioned above, is mainly to obtain several feature points that can calculate the equivalent circuit model parameters values by fitting the e-exponential function, including the intersection point of the e-exponential function and the vertical axis of the spectrum, the ordinate value of the e-exponential function when it is saturated with time t, and the time constant of the e-exponential function (or the horizontal and vertical coordinate values when the discharge time of the abscissa is a time constant). Therefore, according to practical needs, a small number of limited points that are sufficient to obtain the above feature points can be selected. Or otherwise, battery equivalent direct current resistance values corresponding to different discharge time periods can be obtained as much as possible, and further fitting the curve, so as to find the above characteristic points more accurately and systematically, and finally calculating the impedance value of the battery according to the characteristic points, so as to further evaluate the battery life, etc. Various modifications belong to the spirit and scope of the present invention.

In another embodiment of the present invention, the battery under test may include a plurality of cells connected in series, and during each pulse discharge of multiple pulse discharges, each battery cell is performing pulse discharge with the same discharge current and discharge time period to obtain the equivalent direct current resistance value of each battery cell. The equivalent direct current resistance spectrum for each battery cell is drawn according to step 32 shown in FIG. 3, then step 33 is performed to obtain their respective equivalent circuit models parameter value, and then step 34 is performed to calculate the impedance value of each battery cell.

Through the above embodiment of the method for measuring the battery equivalent circuit model parameter value and impedance value, the detection accuracy, application range and real-time performance can be effectively improved, thereby more effectively and accurately evaluating the life and performance of the battery are achieved.

Figure 7A:
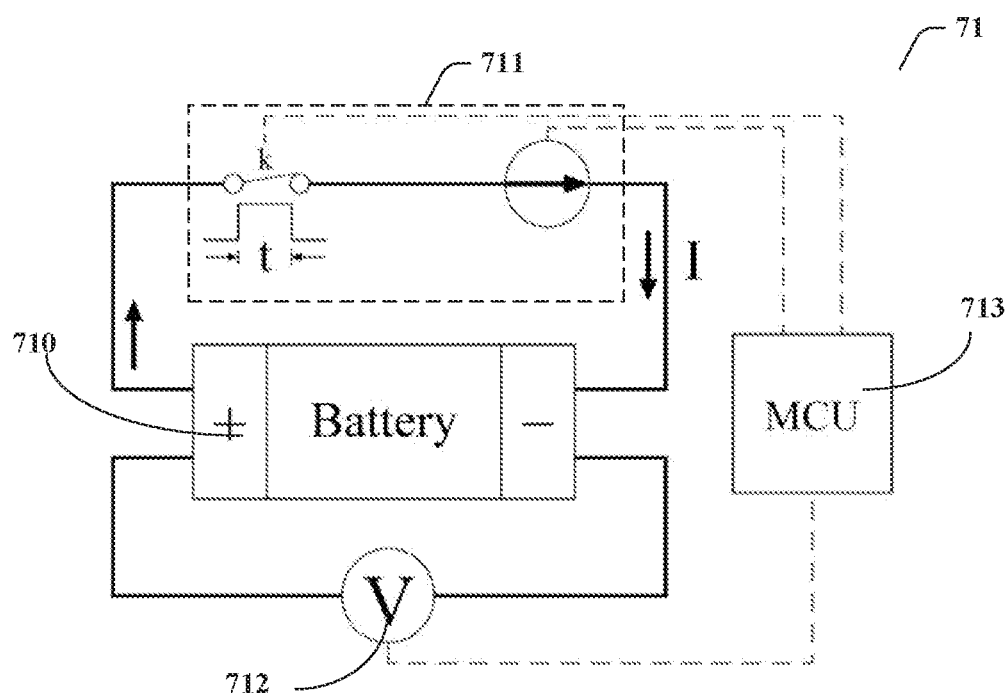
FIG. 7a and FIG. 7b are schematic circuit view of an apparatus for measuring battery impedance values according to an embodiment of the present invention.
Figure 7B:
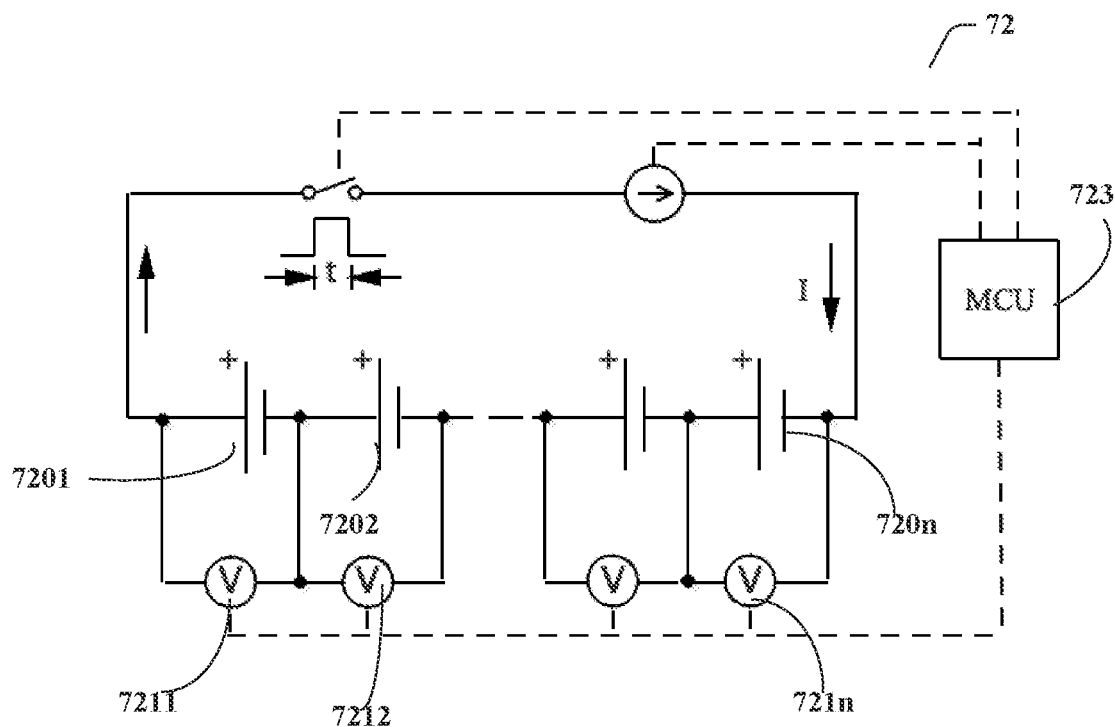

Another aspect of the present invention provides an apparatus for measuring the impedance value of a battery, which can be applied to the method for measuring the impedance value of the battery as shown in FIG. 3. FIG. 7a and FIG. 7b are schematic circuit diagrams of an apparatus for measuring battery impedance according to an embodiment of the present invention.

As shown in FIG. 7a, an apparatus 71 for measuring battery impedance values according to the present invention includes a tested battery 710 and an impedance measuring circuit. The circuit includes conductive paths and is connected to the positive and negative terminals of the battery 710 in the manner shown in FIG. 7a.

More specifically, the impedance measuring circuit includes a power supply unit 711, the power supply unit 711 comprises a direct current power supply and a pulse control switch as outlined by a dotted line, providing different pulse discharge currents and discharge time periods for discharging the tested battery. Exemplarily, the selection of the direct current power supply and the pulse control switch can refer to various types of electronic switches and power supplies available in the market, and the present invention will not expand in this part.

The apparatus 71 for measuring the battery impedance value also comprises a voltage detector 712, which can measure the voltage at both ends of the battery 710, and the voltage includes the normal voltage of the battery 710 when the pulse discharge is not performed, as well as the battery voltage at the end of the pulse discharge.

The apparatus 71 for measuring the battery impedance value also comprises a control unit 713, which can collect the voltage detected by the voltage detector 712 at both ends of the above-mentioned battery 710, and draw the equivalent direct current resistance spectrum according to the above-mentioned method for measuring the battery impedance value as shown in FIG. 3. The control unit 713 can also find and calculate the equivalent circuit model parameter values of the battery according to the equivalent direct current resistance spectrum, such as the battery ohmic resistance value $R_\Omega$, the electric double layer capacitance value $C_d$ and the charge transfer resistance $R_{ct}$, and the impedance value of the battery is obtained by the impedance calculation formula of the battery equivalent circuit. Exemplarily, the control unit 713 may be a micro control unit (Microcontroller Unit, MCU).

In an embodiment of the present invention, the tested battery 710 is a lithium battery, and the equivalent circuit model parameter values of the above-mentioned battery further comprise the solid electrolyte interfacial film resistance value $R_{SEI}$ and the solid electrolyte interfacial film capacitance value $C_{SEI}$.

In another embodiment of the present invention, as shown in FIG. 7b, the tested battery comprises a plurality of battery cells connected in series, 7201, 7202, . . . , 720n, and each battery cell is connected to a voltage detector 7211, 7212, . . . , 721n. The control unit 723 is configured to respectively obtain the equivalent circuit model parameter values of each battery cell, and calculate the impedance value of each battery cell respectively.

For specific calculation methods of the battery equivalent circuit model parameter values and impedance values, reference may be made to the description in the above embodiment shown in FIG. 3, which will not be repeated in this part.

Using the apparatus shown in FIGS. 7a and 7b of the present invention, the impedance value of the battery can be obtained quickly and effectively through pulse discharge at a specific current and calculation based on the battery equivalent model theory. In particular, when using the battery impedance value measuring device with multiple battery cells as shown in FIG. 7b, the application scenarios of measuring battery impedance value can be broadened.

Exemplarily, in the field of new energy vehicles, the power supply of electric vehicles is usually in the form of a series-connected battery pack of multiple battery cells. With the apparatus shown in FIG. 7b of the present invention, it only needs to simply connect a voltage collector to each battery unit, and to measure and calculate each battery unit according to the above-mentioned method for measuring the battery impedance value. Therefore, the method and apparatus of the present invention can simply apply current as the detection input signal, and simultaneously measuring and detecting the impedance value of each battery cell in the automobile battery in real time, providing an important determination factor for effectively evaluating key indicators such as the service life of new energy vehicle batteries.

Another aspect of the present invention also proposes a system for measuring a battery impedance value, including a memory for storing instructions executable by a processor; and a processor for performing the above-mentioned method for measuring a battery impedance value.

Another aspect of the present invention also proposes a computer-readable medium storing computer program codes, the computer program codes implements the above-mentioned method for measuring the battery impedance value when executed by a processor.

The basic concepts have been described above, obviously, for those skilled in the art, the above disclosure of the invention is only an example, and does not constitute a limitation to the present application. Although not expressly stated here, various modifications, improvements and amendments to this application may be made by those skilled in the art. Such modifications, improvements, and amendments are suggested in this application, so such modifications, improvements, and amendments still belong to the spirit and scope of the exemplary embodiments of this application.

Meanwhile, the present application uses specific words to describe the embodiments of the present application. For example, "one embodiment", "an embodiment", and/or "some embodiments" refer to a certain feature, structure or characteristic related to at least one embodiment of the present application. Therefore, it should be emphasized and noted that two or more references to "one embodiment" or "an embodiment" or "an alternative embodiment" in different places in this specification do not necessarily refer to the same embodiment. In addition, certain features, structures or characteristics of one or more embodiments of the present application may be properly combined.

Some aspects of the present application may be entirely implemented by hardware, may be entirely implemented by software (including firmware, resident software, microcode, etc.), or may be implemented by a combination of hardware and software. The above hardware or software may be referred to as "block", "module", "engine", "unit", "component" or "system". The processor can be one or more Application Specific Integrated Circuits (ASIC), Digital Signal Processors (DSPs), Digital Signal Processing Devices (DAPDs), Programmable Logic Devices (PLDs), Field Programmable Gate Arrays (FPGAs), a processor, a controller, a microcontroller, a microprocessor, or a combination thereof. Additionally, aspects of the present application may be embodied as a computer product comprising computer readable program code on one or more computer readable media. For example, computer-readable media may include, but are not limited to, magnetic storage devices (e.g., hard disks, floppy disks, magnetic tape . . . ), optical disks (e.g., compact disk CDs, digital versatile disks DVD . . . ), smart cards, and flash memory devices (e.g., cards, sticks, key drives . . . ).

A computer readable medium may contain a propagated data signal embodying a computer program code, for example, in baseband or as part of a carrier wave. The propagated signal may take many forms, including electromagnetic, optical, etc., or a suitable combination. The computer readable medium can be any computer readable medium other than computer readable storage medium, which can communicate, propagate or transfer the program for use by being connected to an instruction execution system, apparatus or device. Program code on a computer readable medium may be transmitted over any suitable medium, including radio, electrical cables, fiber optic cables, radio frequency signals, or the like, or combinations of any of the foregoing.

In the same way, it should be noted that in order to simplify the expression disclosed in the present application and help the understanding of one or more embodiments of the invention, in the foregoing description of the embodiments of the present application, sometimes multiple features are combined into one embodiment, drawings or descriptions thereof. However, this method of disclosure does not imply that the subject matter of the application requires more features than are recited in the claims. Indeed, embodiment features are less than all features of a single foregoing disclosed embodiment.

In some embodiments, numbers describing the quantity of components and attributes are used, it should be understood that such numbers used in the description of the embodiments use the modifiers "about", "approximately" or "substantially" in some examples. Unless otherwise stated, "about", "approximately" or "substantially" indicates that the stated figure allows for a variation of ±20%. Accordingly, in some embodiments, the numerical parameters used in the specification and claims are approximations that can vary depending upon the desired characteristics of individual embodiments. In some embodiments, numerical parameters should take into account the specified significant digits and adopt the general digit reservation method. Although the numerical ranges and parameters used in some embodiments of the present application to confirm the breadth of the scope are approximate values, in specific embodiments, such numerical values are set as precisely as practicable.

Although the present application has been described with reference to the current specific embodiments, those of ordinary skill in the art should recognize that the above embodiments are only used to illustrate the present application, and various equivalent changes or substitutions can also be made without departing from the spirit of the present application, therefore, as long as the changes and modifications to the above-mentioned embodiments are within the spirit of the present application, they will all fall within the scope of the claims of the present application.

The invention claimed is:

1. A method for measuring a battery impedance value, comprising:
    performing multiple pulse discharges on a battery in multiple different discharge time periods respectively, and separately measuring multiple equivalent direct current resistance values of the battery, comprising measuring the voltage difference and discharge current within each pulse discharge time period to obtain the equivalent direct current resistance value;
    obtaining an equivalent direct current resistance spectrum, the equivalent direct current resistance spectrum comprising a horizontal axis and a vertical axis, the horizontal axis comprising the multiple different discharge time periods, and the vertical axis comprising the equivalent direct current resistance values corresponding to the different discharge time periods;
    obtaining an equivalent circuit model parameter value of the battery according to the equivalent direct current resistance spectrum, wherein, the equivalent circuit model parameter value further comprises: a battery ohmic resistance value Rn, an electric double layer capacitance value Cd and a charge transfer resistance Rct, obtaining the equivalent circuit model parameter value further comprises:
    fitting the equivalent direct current resistance spectrum to an e-exponential function, and the value of an e-exponential fitting curve when it intersects the vertical axis is the battery ohmic resistance value Ra;
    subtracting the battery ohmic resistance value Rn from a maximum value of the equivalent direct current resistance spectrum to obtain the charge transfer resistance Rct;
    determining a discharge time constant according to the e-exponential fitting curve, and calculating the electric double layer capacitance value Cd according to the discharge time constant and the charge transfer resistance Rct; and
    calculating an impedance value of the battery by an impedance calculation formula of a battery equivalent circuit according to the equivalent circuit model parameter value,
    wherein the measuring multiple equivalent direct current resistance values of the battery, obtaining the equivalent direct current resistance spectrum, and obtaining the equivalent circuit model parameter value of the battery according to the equivalent direct current resistance spectrum are performed at time domain,
    wherein the fitted e-exponential function of equivalent direct current resistance comprises the battery ohmic resistance value Rn, the charge transfer resistance Rct, pulse discharge time, and the discharge time constant,
    wherein the multiple different discharge time periods have durations of adjacent discharge time periods being different from each other,
    wherein the method further comprises obtaining the impedance value of a rechargeable power battery in real time, and
    wherein the method further comprises evaluating a service life of the rechargeable power battery based on the impedance value of the rechargeable power battery.

2. The method of claim 1, wherein performing multiple pulse discharges on a battery in multiple different discharge time periods, and separately measuring multiple equivalent direct current resistance values of the battery further comprises:
    measuring a normal voltage of the battery prior to the pulse discharges;
    providing a discharge current and a discharge time period, and the battery performs the pulse discharges according to the discharge current and the discharge time period;
    measuring a battery voltage at an end of the pulse discharges of the battery, and calculating a voltage difference according to the normal voltage;
    calculating the equivalent direct current resistance values of the battery at the discharge time based on the voltage difference and the discharge current; and
    changing the discharge time, repeating above steps of measuring the equivalent direct current resistance values of the battery, so as to obtain the equivalent direct current resistance values corresponding to the multiple different discharge times.

3. The method of claim 1, wherein, a value range of the pulse discharge time periods is 1 μs-1 s.

4. The method of claim 1, wherein, when the battery includes multiple battery cells connected in series, performing multiple pulse discharges on a battery in multiple different discharge time periods, and separately measuring multiple equivalent direct current resistance values of the battery further comprises: during each pulse discharge of the multiple pulse discharge, performing pulse discharge on each battery cell with same discharge current and discharge time period to obtain the equivalent direct current resistance value of each battery cell.

5. A method for measuring a battery impedance value,
    comprising: performing multiple pulse discharges on a battery in multiple different discharge time periods respectively, and separately measuring multiple equivalent direct current resistance values of the battery, comprising measuring the voltage difference and discharge current within each pulse discharge time to obtain the equivalent direct current resistance value;

obtaining an equivalent direct current resistance spectrum, the equivalent direct current resistance spectrum comprising a horizontal axis and a vertical axis, the horizontal axis comprising the multiple different discharge time periods, and the vertical axis comprising the equivalent direct current resistance values corresponding to the different discharge time periods;

obtaining an equivalent circuit model parameter value of the battery according to the equivalent direct current resistance spectrum, wherein, the equivalent circuit model parameter value further comprises: a battery ohmic resistance value Ra, an electric double layer capacitance value Cd, a charge transfer resistance Rct, a solid electrolyte interfacial film resistance value RSEI and a solid electrolyte interfacial film capacitance value CSEI, obtaining the equivalent circuit model parameter value comprises:

fitting a high frequency part of the equivalent direct current resistance spectrum to an e-exponential function, and the value of a high frequency e-exponential fitting curve when it intersects the vertical axis is the battery ohmic resistance value Rn;

subtracting the battery ohmic resistance value Ra from a median value of the equivalent direct current resistance spectrum to obtain the solid electrolyte interfacial film resistance value RSEI;

determining a first discharge time constant according to the high frequency e-exponential fitting curve, and calculating the solid electrolyte interfacial film capacitance value CsEI according to the first discharge time constant and the solid electrolyte interfacial film resistance value RsEI;

fitting a low frequency part of the equivalent direct current resistance spectrum to the e-exponential function to obtain a low frequency e-exponential fitting curve, subtracting the battery ohmic resistance Rn and the solid electrolyte interfacial film resistance RsEI from a maximum value to obtain the charge transfer resistance Rct; and determining a second discharge time constant according to the low frequency e-exponential fitting curve, and calculating the electric double layer capacitance value Cd according to the second discharge time constant and the charge transfer resistance Ret, wherein the measuring multiple equivalent direct current resistance values, obtaining the equivalent direct current resistance spectrum, and obtaining the equivalent circuit model parameter value of the battery according to the equivalent direct current resistance spectrum are performed at time domain, wherein the fitted e-exponential function of equivalent direct current resistance comprises the battery ohmic resistance value Ra, the solid electrolyte interfacial film resistance value RsEI, the charge transfer resistance Rct, pulse discharge time, the first discharge time constant, and the second discharge time constant, wherein the first discharge time constant corresponds to the high frequency part and the second discharge time constant corresponds to the low frequency part, wherein the multiple different discharge time periods have durations of adjacent discharge time periods being different from each other, wherein the method further comprises obtaining the impedance value of a rechargeable power battery in real time, and wherein the method further comprises evaluating a service life of the rechargeable power battery based on the impedance value of the rechargeable power battery.

6. The method of claim 5, wherein, when the battery includes multiple battery cells connected in series, performing multiple pulse discharges on a battery in multiple different discharge time periods, and separately measuring multiple equivalent direct current resistance values of the battery further comprises: during each pulse discharge of the multiple pulse discharge, performing pulse discharge on each battery cell with same discharge current and discharge time period to obtain the equivalent direct current resistance value of each battery cell.

7. An apparatus for measuring a battery impedance value, comprising a battery and an impedance measurement circuit, and the impedance measurement circuit comprising a conductive path connected to a positive terminal and a negative terminal of the battery, wherein the impedance measurement circuit comprises:

a power supply unit, comprising a direct current power supply and a pulse control switch configured to perform a pulse discharge of a battery using the pulse control switch to create different pulse discharge durations and respective pulse discharge currents;

a voltage detector, configured to measure a voltage across the battery, the voltage including a normal voltage measured prior to the pulse discharge and a battery voltage at the end of the pulse discharge; and a control unit, configured to collect the voltage, calculate multiple equivalent direct current resistance values and obtain an equivalent direct current resistance spectrum of the battery, and obtain an equivalent circuit model parameter value of the battery and calculate an impedance value of the battery according to the equivalent direct current resistance spectrum, wherein, calculating the equivalent direct current resistance values comprises measuring a voltage difference and a discharge current within each pulse discharge time period to obtain the equivalent direct current resistance value;

the equivalent direct current resistance spectrum comprises a horizontal axis and a vertical axis, the horizontal axis comprising the multiple different discharge time periods, and the vertical axis comprising the equivalent direct current resistance values corresponding to the different discharge time periods;

the equivalent circuit model parameter value further comprises: a battery ohmic resistance value Rn, an electric double layer capacitance value Ca and a charge transfer resistance Rctz wherein the control unit is configured to calculate multiple equivalent direct current resistance values, obtain the equivalent direct current resistance spectrum, and obtain the equivalent circuit model parameter value of the battery are performed at time domain, wherein the control unit is configured to obtain the equivalent circuit model parameter value by:

fitting the equivalent direct current resistance spectrum to an e-exponential function, and the value of an e-exponential fitting curve when it intersects the vertical axis is the battery ohmic resistance value Rn, wherein a fitted e-exponential function of equivalent direct current resistance comprises the battery ohmic resistance value Rn, the charge transfer resistance Rct, pulse discharge time and the discharge time constant;

subtracting the battery ohmic resistance value Rn from a maximum value of the equivalent direct current resistance spectrum to obtain the charge transfer resistance Rct;

determining a discharge time constant according to the e-exponential fitting curve, and calculating the electric double layer capacitance value Cd according to the discharge time constant and the charge transfer resistance Rct; and calculating an impedance value of the battery by an impedance calculation formula of a battery equivalent circuit according to the equivalent circuit model parameter value;

or the control unit is configured to obtain the equivalent circuit model parameter value by:

fitting a high frequency part of the equivalent direct current resistance spectrum to an e-exponential function, and the value of a high frequency e-exponential fitting curve when it intersects the vertical axis is the battery ohmic resistance value Rn;

subtracting the battery ohmic resistance value Rn from a median ordinate value of the equivalent direct current resistance spectrum to obtain the solid electrolyte interfacial film resistance value RSEI;

determining a first discharge time constant according to the high frequency e-exponential fitting curve, and calculating the solid electrolyte interfacial film capacitance value CsEI according to the first discharge time constant and the solid electrolyte interfacial film resistance value RsEI;

fitting a low frequency part of the equivalent direct current resistance spectrum to the e-exponential function to obtain a low frequency e-exponential fitting curve, subtracting the battery ohmic resistance Rn and the solid electrolyte interfacial film resistance RsEI from a maximum value to obtain the charge transfer resistance Rct; and determining a second discharge time constant according to the low frequency e-exponential fitting curve, and calculating the electric double layer capacitance value Cd according to the second discharge time constant and the charge transfer resistance Rct;

wherein the fitted e-exponential function of equivalent direct current resistance comprises the battery ohmic resistance value Ra, the solid electrolyte interfacial film resistance value RsEI, the charge transfer resistance Rct, pulse discharge time, the first discharge time constant, and the second discharge time constant, wherein the first discharge time constant corresponds to the high frequency part and the second discharge time constant corresponds to the low frequency part;

wherein the multiple different discharge time periods have durations of adjacent discharge time periods being different from each other, wherein the control unit is configured to obtain the impedance value of a rechargeable power battery in real time, and wherein a service life of the rechargeable power battery is evaluated based on the impedance value of the rechargeable power battery.

8. The apparatus of claim 7, wherein, when the battery is a lithium battery, the equivalent circuit model parameter values of the battery further comprises a solid electrolyte interface film resistance value RSEI and a solid electrolyte interfacial film capacitance value CSEI.

9. The apparatus of claim 7, wherein, the battery comprises multiple battery cells connected in series, and both ends of each battery cell are connected to a voltage detector, and the control unit is configured to separately obtain the equivalent circuit model parameter values of each battery cell, and calculate the impedance value of each battery cell respectively.

10. The apparatus of claim 7, comprising a memory unit, configured to store instructions to be executed by a processor.

11. A system for measuring battery impedance value, comprising:
a memory unit, configured to store instructions to be executed by a processor; and
the processor, configured to execute the instructions to realize a method according to claim 1.

12. A non-transitory computer-readable medium storing computer program codes, wherein the computer program codes implements a method according to claim 1 when executed by a processor.

13. The method of claim 1, wherein a resistor-capacitor structure of the battery determines an index of the e-exponential function, and a Fourier transform is used to establish a relationship between the equivalent direct current resistance value and an alternating-current impedance.

14. The method of claim 13, wherein time functions are selected for time constants of different battery structures.

* * * * *